(12) United States Patent
Regner et al.

(10) Patent No.: US 6,391,468 B2
(45) Date of Patent: May 21, 2002

(54) SOLDERED INTEGRATED CIRCUIT CONNECTIONS

(75) Inventors: Richard Regner, Meridian; Scott Butler, Greenleaf; Carey Blue, Kuna, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/822,551

(22) Filed: Mar. 30, 2001

Related U.S. Application Data

(60) Continuation of application No. 09/550,784, filed on Apr. 17, 2000, now Pat. No. 6,248,452, which is a continuation of application No. 09/270,695, filed on Mar. 17, 1996, now Pat. No. 6,094,832, which is a division of application No. 08/986,541, filed on Dec. 8, 1997, now Pat. No. 6,012,231.

(51) Int. Cl.$^7$ ............... B22F 5/10; H05K 3/34
(52) U.S. Cl. ............ 428/553; 428/599; 228/180.1
(58) Field of Search .............. 428/553, 599; 228/180.1

(56) References Cited

U.S. PATENT DOCUMENTS

| | | | | |
|---|---|---|---|---|
| 4,270,465 A | * | 6/1981 | Lim |
| 4,982,892 A | * | 1/1991 | Parla et al. |
| 5,062,567 A | * | 11/1991 | Nishihara et al. |
| 5,339,536 A | * | 8/1994 | Buttars |
| 5,534,127 A | * | 7/1996 | Sakai |
| 5,558,271 A | * | 9/1996 | Rostoker et al. |
| 5,639,013 A | * | 6/1997 | Jairazbhoy et al. |
| 5,693,559 A | * | 12/1997 | Taniguchi et al. |
| 5,718,361 A | * | 2/1998 | Braun et al. |
| 5,740,730 A | * | 4/1998 | Thompson, Sr. |
| 6,026,566 A | * | 2/2000 | Urban et al. |

* cited by examiner

*Primary Examiner*—Deborah Jones
*Assistant Examiner*—Jason Savage
(74) *Attorney, Agent, or Firm*—Trop, Pruner & Hu, P.C.

(57) ABSTRACT

Solder paste is deposited using a solder stencil with an aperture having a concave edge in order to reduce the formation of solder balls. The solder deposit may be formed on a pad such that the paste has a concave edge. Solder paste deposits may be made on adjacent pads with the concave surfaces facing one another.

6 Claims, 2 Drawing Sheets

SOLDERED INTEGRATED CIRCUIT CONNECTIONS

This is a continuation of prior application Ser. No. 09/550,784 filed Apr. 17, 2000 (Now U.S. Pat. No. 6,248,452) which is a continuation of prior application Ser. No. 09/270,695 filed Mar. 17, 1999 (now U.S. Pat. No. 6,094,832) which is a divisional of application Ser. No. 08/986,541 filed Dec. 8, 1997 (now U.S. Pat. No. 6,012,231).

This invention relates generally to a solder stencil for applying a solder paste to a pad in the manufacture of integrated circuits. More particularly, the present invention is directed to reducing the creation of solder balls.

BACKGROUND OF THE INVENTION

Solder stencils are generally utilized in the manufacture of contacts on printed circuit boards to define the shape of a solder paste on the surface to be soldered. Solder paste is a suspension of flux and small spheres of solder particles. When heated, the paste forms a solder which secures two metal pieces together. Solder paste is screen printed onto a circuit board using a stencil. The stencil is a thin sheet of metal that has a desired hole pattern formed in the stencil.

In a reflowing process, the solder melts, forming a mechanical and electrical connection between printed circuit board land pads and an electrical component. Flux encourages the formation of this connection. Flux may be removed through a cleaning process or left on the board with the so-called no clean process.

One problem which may occur with solder paste is the formation of solder balls. Solder balls are small spherical solder particles which are formed away from the main solder pool during reflow. If these balls become loose at any time after the product is manufactured, they can roll to a position where they can short an electrical component. Solder balling may occur around components and over the board. Large solder balls may be associated with small and low clearance passive components such as 0805 and 1206 resistor and capacitor connection sites. The large solder balls may not be removed in the cleaning process and will persist with the no-clean process.

In addition, excessive solder balling may prevent the solder from making a good solder joint fillet. Thus, the formation of solder balls may create reliability issues. There has been a continuous effort to minimize the occurrence of solder balling. See C. A. Harper, Electronic Packaging & Interconnection Handbook, 2d Edition, McGraw Hill (1997), at p. 5.54.

It would be highly desirable to have a technique for forming soldered connections using solder paste which reduces the occurrence of solder balling.

SUMMARY OF THE INVENTION

In accordance with one aspect of the present invention, a solder stencil includes a body having at least one solder aperture. The aperture has a concave edge profile.

In accordance with another aspect of the present invention, a solder stencil for depositing solder paste on a pad includes a plate having at least one solder aperture. The aperture has an area less than the area of the pad.

In accordance with still another aspect of the present invention, a method of depositing solder paste includes the step of forming a deposit of solder paste on the pad. The deposit has an area of less than the area of the pad.

In accordance with another aspect of the present invention, a pad for forming a soldered contact includes a pad and a layer of solder paste on the pad. The solder paste has a concave edge profile.

In accordance with yet another aspect of the present invention, a pad for forming a soldered contact includes a pad and a layer of solder paste on the pad. The layer leaves a concave portion of the pad uncovered by solder paste.

In accordance with but another aspect of the present invention, a method of depositing solder paste includes the step of forming a deposit of solder paste with a concave edge. The solder paste is then deposited on the pad.

In accordance with another aspect of the present invention, a method of depositing solder paste includes the step of forming a solder paste deposit. The solder paste is deposited on the pad such that the area of the solder paste is less than the area of the pad.

These aspects of the present invention may be advantageous for a number of reasons including reducing the occurrence of solder balls.

DESCRIPTION OF THE PREFERRED EMBODIMENTS

Figure 1:
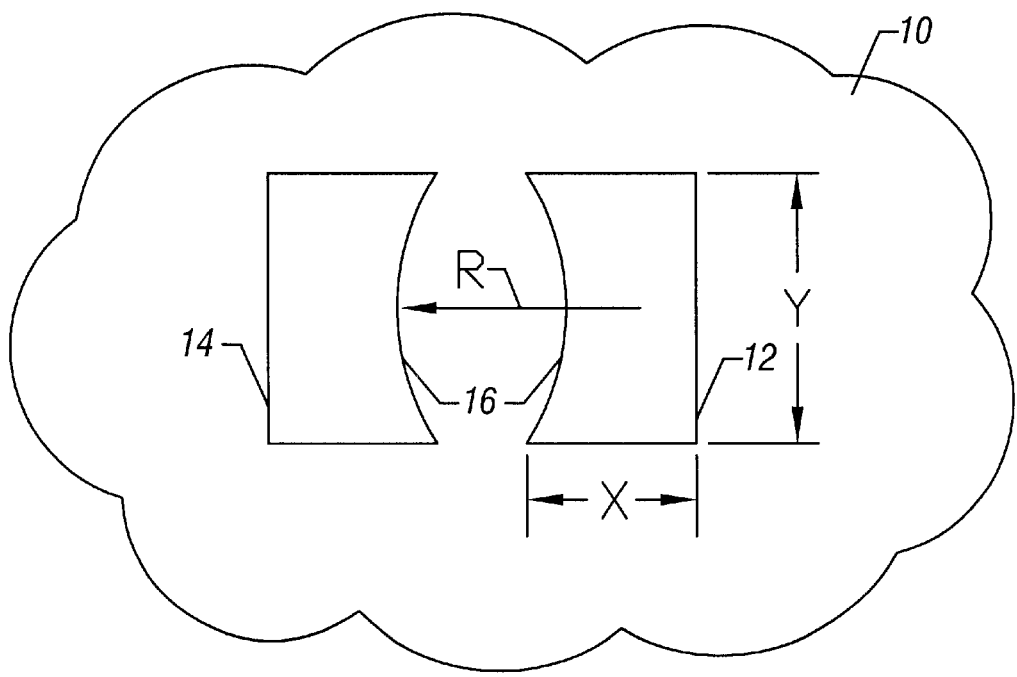
FIG. 1 is a top plan view of a solder stencil having solder apertures.

Referring to the drawing wherein like reference characters are used for like parts throughout the several views, a solder stencil 10 shown in FIG. 1 may be used to apply solder paste to pads on printed circuit boards. The solder stencil 10 is conventionally made of a thin sheet of metal such as brass, stainless steel, molybdenum, alloy-42, or nickel.

The stencil 10 includes a hole pattern represented by the two holes 12 and 14 in FIG. 1. Each of the holes 12 and 14 is of a generally rectangular shape with facing edges 16 having a concave configuration. The holes 12, 14 may be formed by conventional techniques including chemical etching, laser cutting, electropolishing, electroplating and electroforming.

As used herein, "concave" refers to an inwardly directed configuration that would include curved configurations, V-shaped configurations and other like configurations.

Figure 2:
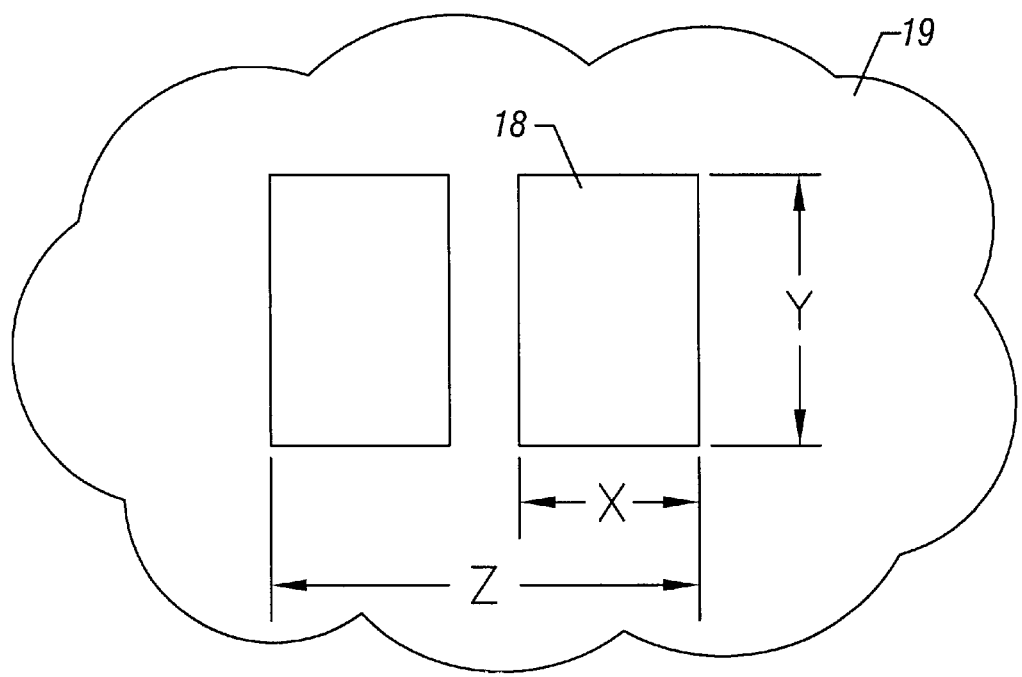
FIG. 2 is a top plan view of a pair of pads on a printed circuit board.

A typical pair of bonding pads 18 of a type used for small passive components such as a capacitor or resistor may be positioned on a printed circuit board 19, as shown in FIG. 2. Each pad 18 has a width "X" and a length "Y". The pads 18 may, for example, be land pads on a conventional printed circuit board. The land pads are generally coated with a deposited layer of solder paste. The solder paste is reflowed to electrically connect a component to the pad 18. The soldering process creates both an electrical and a mechanical connection.

In accordance with one aspect of the present invention, the length Y of the bond pad 18 corresponds generally to the length Y of the solder stencil apertures 12, 14. However, the width X of the bond pad 18 is generally greater than the width of the stencil apertures 12, 14 as indicated in FIG. 2. Generally the width dimensions X of the solder apertures 12, 14 are about 20–30% less than the width X of the corresponding bond pad 18.

The radius of curvature "R" of the concave edge 16 extends from about 0.05 inches to about 0.1 inches and is roughly about twice the length Y of the aperture 12, 14. The distance between the outside edges of the land pads is indicated as "Z". Exemplary approximate dimensions in inches for a 0.006 inch stencil thickness are as follows:

|      |         | X      | Y     | Z     | R      |
|------|---------|--------|-------|-------|--------|
| 0603 | Pad     | 0.0175 | 0.035 | 0.075 |        |
|      | Stencil | 0.0140 | 0.035 |       | 0.0591 |
| 0805 | Pad     | 0.035  | 0.055 | 0.1   |        |
|      | Stencil | 0.0290 | 0.055 |       | 0.0781 |
| 1206 | Pad     | 0.035  | 0.065 | 0.15  |        |
|      | Stencil | 0.0290 | 0.060 |       | 0.092  |

For a 0.008 inch stencil thickness the following are exemplary approximate dimensions for conventional 0603, 0805, 1206 components:

|      |         | X      | Y     | Z     | R      |
|------|---------|--------|-------|-------|--------|
| 0603 | Pad     | 0.0175 | 0.035 | 0.075 |        |
|      | Stencil | 0.0125 | 0.035 |       | 0.0590 |
| 0805 | Pad     | 0.035  | 0.055 | 0.1   |        |
|      | Stencil | 0.025  | 0.055 |       | 0.092  |
| 1206 | Pad     | 0.035  | 0.065 | 0.15  |        |
|      | Stencil | 0.025  | 0.065 |       | 0.092  |

Figure 3:
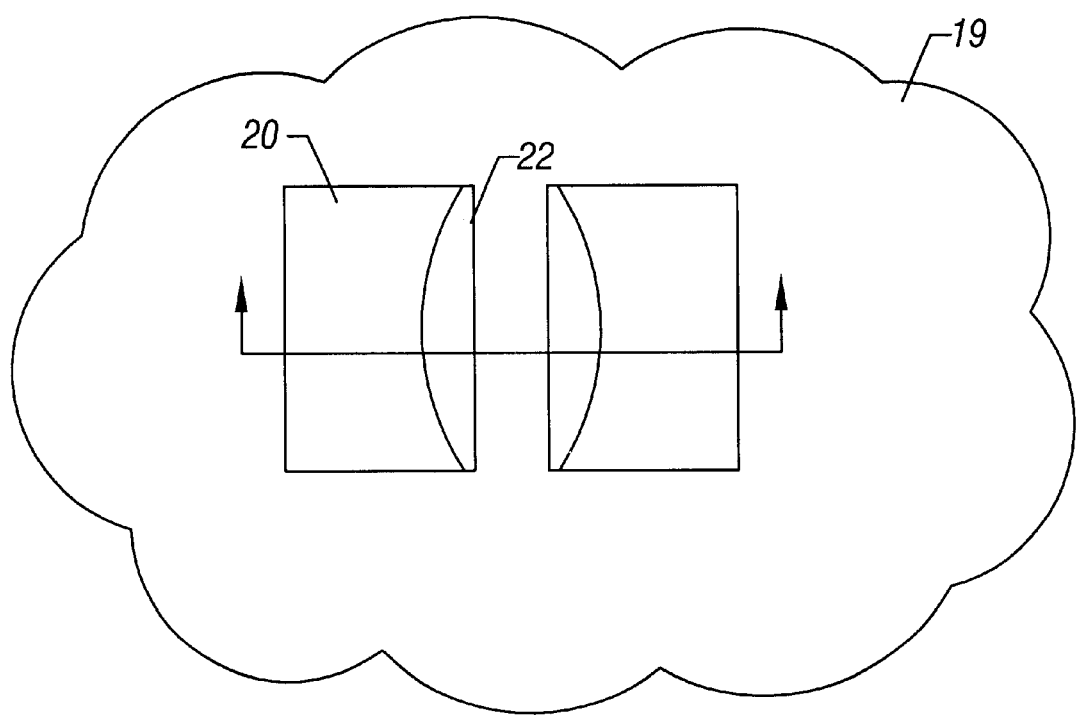
FIG. 3 is a top plan view of solder paste on top of the solder pad shown in FIG. 2.
Figure 4:
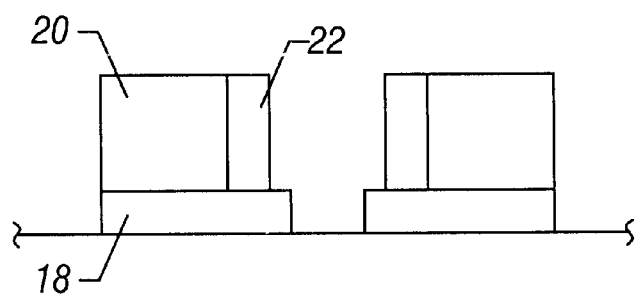
FIG. 4 is a cross-sectional view taken generally along the line 4—4 in FIG. 3.

As shown in FIGS. 3 and 4, the deposited paste 20 does not completely cover the bond pad 18 but, instead, a concave-shaped exposed area 22 remains. As a result of the concave configuration of the deposited paste 20 and the apertures 12 in the stencil 10, the occurrence of solder balls decreases. This is particularly important in situations where no clean fluxes are utilized.

The prevention of solder balling is particularly applicable to forming solder connections with surface mount packaging. The surface mount components are placed onto a printed circuit board and into the deposited paste and then the paste is reflowed. As a result the surface mount components are secured to the pads.

While this invention has been described with respect to a limited number of preferred embodiments, those skilled in the art will appreciate numerous modifications and variations. It is intended that the appended claims cover all such modifications and variations as fall within the true spirit and scope of the present invention.

What is claimed is:

1. An assembly for forming a soldered contact comprising:
   a pad; and
   a layer of solder paste on said pad, said layer having an exterior, inwardly indented edge, said edge shaped to reduce the formation of solder balls.

2. The assembly of claim 1 wherein said exterior edge is noncircular.

3. The assembly of claim 1 wherein said pad is incompletely covered by said layer of solder paste.

4. The assembly of claim 1 wherein said edge is transverse to the surface of said pad.

5. The assembly of claim 1 wherein said layer of said solder paste includes a peripheral surface including said concave indented edge, said peripheral surface also including at least two transversely related sides.

6. The assembly of claim 5 wherein said peripheral surface includes at least three transversely related sides.

* * * * *